Dec. 25, 1962 J. R. VIGIANO 3,070,751

PARAMETRIC AMPLIFIERS WITH INCREASED GAIN BANDWIDTH PRODUCT

Filed Jan. 25, 1960 4 Sheets-Sheet 1

INVENTOR.
JACK R. VIGIANO
BY Theodore Hafner
ATTORNEY

INVENTOR.
JACK R. VIGIANO
BY Theodore Hafner
ATTORNEY

PARAMETRIC AMPLIFIERS WITH INCREASED GAIN BANDWIDTH PRODUCT

Filed Jan. 25, 1960 4 Sheets-Sheet 3

INVENTOR.
JACK R. VIGIANO
BY Theodore Hafner
ATTORNEY

INVENTOR.
JACK R. VIGIANO
BY Theodore Hafner
ATTORNEY

United States Patent Office 3,070,751
Patented Dec. 25, 1962

3,070,751

PARAMETRIC AMPLIFIERS WITH INCREASED GAIN BANDWIDTH PRODUCT

Jack R. Vigiano, 283 Bedell Ave., Freeport, N.Y.

Filed Jan. 25, 1960, Ser. No. 4,373
8 Claims. (Cl. 330—7)

This invention relates to non-linear reactive amplifiers and more particularly to amplifiers and converters including non-linear reactive diodes.

One of the objects of the invention is to connect double tuned band pass filter circuits to the various radio frequency inputs, radio frequency and/or idler outputs or idler termination circuits respectively, and to interconnect the various band pass filter circuits by means of non-linear diodes which, in turn, are also controlled by a pump oscillator of predetermined frequency range.

A more specific object of the invention is to provide gain at wider bandwidth from a negative resistance diode by arranging the circuit so that the fractional bandwidth of a higher frequency idler signal is effectively transferred percentage-wise to the lower desired signal pass band of the two idler frequency groups created by the modulation process involving the lower idler frequencies.

These and other objects of the invention will be more fully apparent from the drawings annexed herewith in which FIG. 1 illustrates in block diagram certain principles of the invention.

Figure 1:
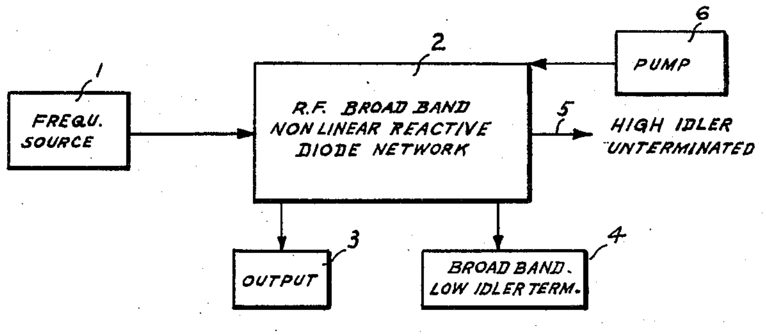

In FIG. 1 the signal input of a predetermined frequency range derived from a source 1 is applied to one pole of a multi-pole network 2 including one or several non-linear reactive diodes and broad band radio frequency circuitry as will be described further below. The radio frequency signal output is obtained at 3 from another pole of network 2 while the idler circuit, including a broad band low frequency termination, is indicated at 4 and applied to another pole of network 2.

The high idler frequency may be derived at 5 and if not terminated.

The pump frequency for the diode or diodes is applied from a source 6 to a fifth pole of multi-pole network 2.

In order to facilitate understanding structure and operation of non-linear reactive diodes such as used in combination with broad band multi-pole coupling networks in accordance with the invention, the following should be noted:

A time-varying reactance connected in a suitable circuit gives amplification. The name varactor has been proposed for the variable reactance device used in a reactance amplifier. At low frequencies, one can use mechanically-varied circuit elements. Thus, the vibrating-reed electrometer uses a mechanically-varied capacitor. When a D.C. voltage is applied to such a capacitor, an A.C. signal of finite power may be extracted. The D.C. current is the almost negligible leakage of a good capacitor, so the D.C. power required is extremely small. Large amplification and a high input impedance result. The power supply for the amplifier is the motor that varies the geometry of the capacitor.

High-frequency reactance amplifiers use electrical means of varying reactance. Since the charge-voltage characteristic of semiconductor diodes is non-linear, the small-signal capacitance $dQ/dV$ can be varied by varying the voltage. The source of variable voltage is called the pump, the beating oscillator, or the carrier supply. The pump, replacing the motor of the mechanically-varied capacitor, is the power supply for non-linear reactance amplification.

The practical value of reactance amplification by semiconductor diodes has been demonstrated from audio frequencies to 6000 mc.

Non-linear reactance does not necessarily afford a means of generating oscillations from a D.C. power supply. However, varactor diodes are excellent harmonic generators and can multiply the frequency of a transistor oscillator to provide adequate pump power, at least for UHF reactance amplifiers. In this way, silicon transistors and silicon diodes may be combined to give low-noise all-solid-state VHF amplification.

The inherent low-noise qualities of reactance amplification make its use very attractive in low noise receivers for radar, communication, missile and radio astronomy applications.

Any PN junction diode has a non-linear charge voltage characteristic, which is all that is required to make a diode amplifier. The varactor, however, is a diode designed to minimize high frequency loss. The loss of a varactor is approximately 100 times smaller than the loss of some other junction diodes used as voltage-dependent capacitors in the 50 megacycle and lower frequency range.

To achieve low loss, a mesa-type diffused silicon design has been used in varactors. Silicon rather than germanium was selected due to its inherent excellent properties at elevated temperatures, its sharper breakdown characteristic, and particularly because its lower saturation current allows voltage swings further into the positive region without conduction current and its associated noise and losses. Thus, low noise can be obtained without refrigeration.

The junction is produced on slices of silicon by solid-state diffusion of appropriate impurities. Then a small "mesa" is formed to reduce the capacitance to a value suitable for microwave use.

Figure 2:
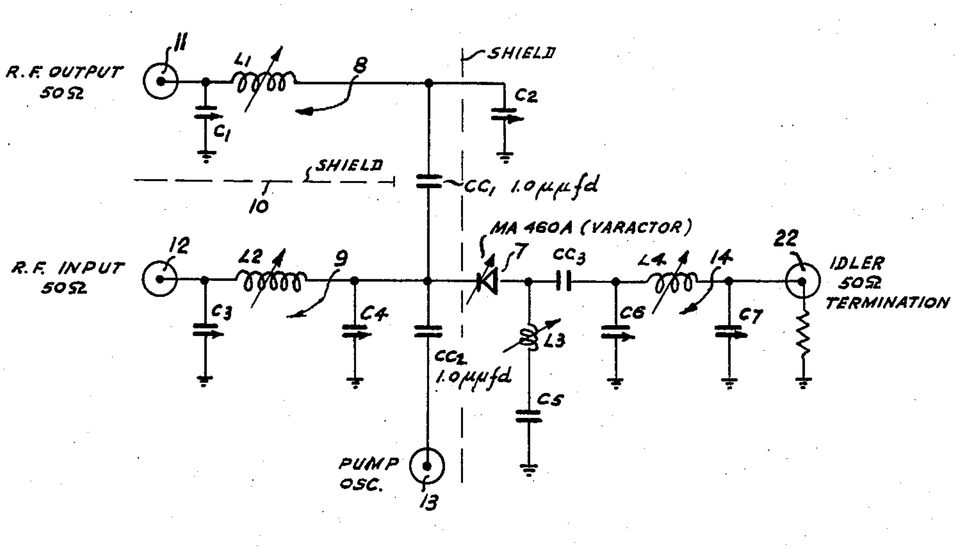
FIG. 2 illustrates a broad band radio frequency amplifier also in accordance with the invention.

Bearing these characteristics of non-linear reactive diodes in mind, in accordance with the invention, a radio frequency broad band amplifier is shown to contain as illustrated in FIG. 2 a non-linear reactive diode 7 preferably a varactor of the Ma460A type, which is connected at one side over two tunable circuits 8, 9, which are shielded from each other as schematically indicated at 10, to radio frequency input and output terminals, respectively, as indicated at 11 and 12.

The double tuned radio frequency circuit 8, 9 consists of capacitors C1, C2, C3, C4 and inductance L1, L2 with coupling capacitor CC1. This is essentially a double tuned filter with an input and output impedance of 50 ohms. Varactor 7 may be connected to the high impedance point on either side of the filter. A pump oscillator is coupled at 13 to varactor 7 through a small coupling capacitor (CC2). The pump may be coupled to either side of the varactor. The pump frequency $f_0$ is approximately 6 times the RF signal frequency. In practice almost any pump frequency has been found to work as long as it is at least 2 times the RF signal frequency.

Varactor 7 at its other side is connected to the idler circuit 14, which is also a double tuned circuit with a 50 ohm termination and preferably tuned to the lower side band idler frequency. The bandwidth of idler circuit 14 should be substantially the same as the RF bandwidth. Stability of the amplifier is accomplished by providing a "load" for the idler energy over the desired bandwidth. Peak-to-valley of the double tuned circuits should be kept to a minimum.

The pump oscillator is connected to the amplifier at 13 over a line including a 50 ohm line (not shown) and a variable 50 ohm attenuator (not shown) to vary the pump power. The length of the 50 ohm line may be varied to vary the phase of the pump oscillator.

Alignment of the amplifier is effected at first with the pump power disconnected at 13. The radio frequency filter 8, 9 is aligned first, and then the idler circuit 14 is aligned by connecting a sweep generator of idler frequency to the radio frequency side of varactor 7. The pump oscillator is then connected at 13 and both circuits 8, 9 and 10 are readjusted for maximum gain.

Preferred circuit values will be apparent from the folliwing list:

| | |
|---|---|
| C1, 3 | 1–18 μμfd. |
| C2, 4 | .5–8 μμfd. |
| C5 | .5–12 μμfd. |
| C6 | .5–12 μμfd. |
| C7 | .5–12 μμfd. |
| CC3 | Approx. .25 μμfd. to .5 fd. |
| CC1 | 1.0 to 2.2 μμfd. |
| CC2 | 1.0 to 2.0 μμfd. |
| L1, L2 | 6 turns to 12 turns #20 approx. 1/4" dia. |
| L3, L4 | 1/8" copper strap approx. 1/2" to 1 1/2" long. |

The five last-mentioned elements are dependent upon the frequency $f_0$ of the RF and idler circuits.

Although the circuit shown in FIG. 2 is designed as a radio frequency amplifier, it may also be used as an up-converter if the idler energy is detected and used.

The bandwidth will be determined by the narrowest of the two circuits, RF and idler circuits, if they are not identical in bandwidth.

The following values have been measured on this amplifier for the two following examples:

*Example 1*

| | |
|---|---|
| RF $f_0$—100 mc. | Idler $f_0$—550 mc. |
| Pump $f_0$—650 mc. | Idler gain—20 db |
| Gain—20 db | Idler Bw.—10 mc. |
| N.F.—3 db | N.F.—Not. meas. |
| Bw.—10 mc.—3 db | |
| Pump power—50 mw. | |

*Example 2*

| | |
|---|---|
| RF $f_0$—200 mc. | Idler $f_0$—900 mc. |
| Pump $f_0$—1100 mc. | Idler gain—10 db |
| Gain—10 db | Idler Bw.—20 mc. |
| N.F.—Not. meas. | N.F.—Not. meas. |
| Bw.—20 mc.—3 db | |

Figure 3:
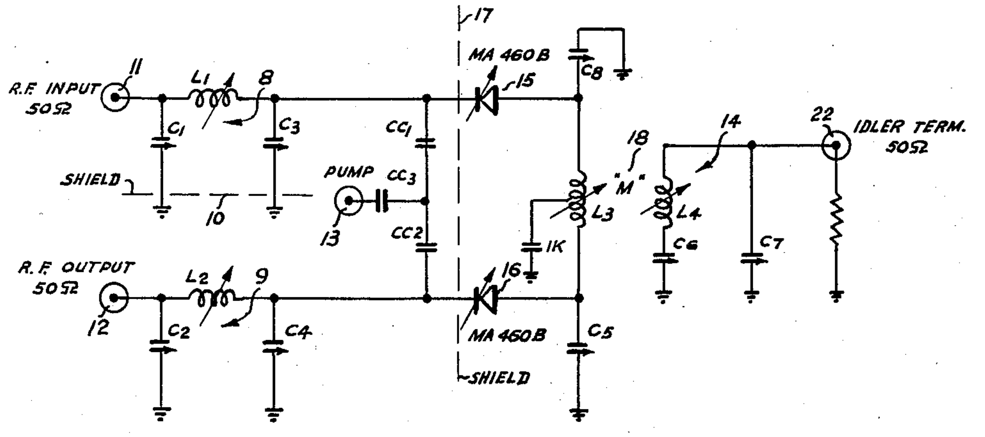
FIGS. 3, 4 and 5 show modifications of FIG. 2.

FIG. 3 shows a modification of the radio frequency amplifier shown in FIG. 1 in that two varactors 15, 16 are used in a push-pull connection, again connected at one side (and in this case on relatively reversed diode terminals) over tuned circuits 8, 9 to radio frequency input and output terminals 11, 12 respectively; the pump oscillator is applied at 13 and coupled to points symmetrical with respect to tuned circuits 8, 9.

In addition to shield 10 separating tuned circuits 8, 9 another shield 17 separates the radio frequency network 8, 9 from the idler circuit 14 which is inductively and tunably coupled through inductances 18 to the other ends of varactors 15, 16 respectively.

In this push-pull connection of varactors 15, 16, stability was found to be improved and gain bandwidth increased.

Figure 4:
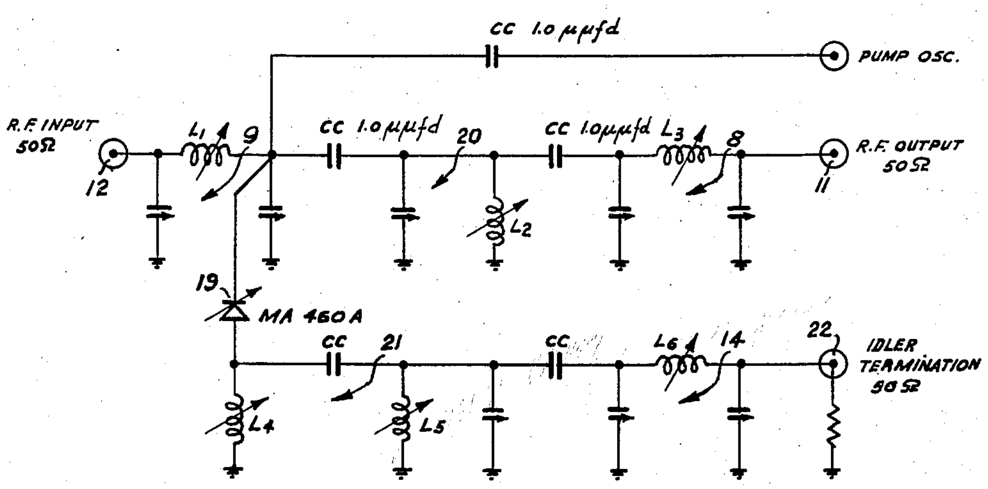

In the modification of FIG. 4, the multi-pole networks are shown to be triple-tuned, i.e., varactor 19 is shown to be connected at one end over tuned circuits 9 and a cascade of two-tuned circuits 8 and 20 to radio frequency input and output terminals 11, 12 respectively while the other side of varactor 19 is similarly connected, over a triple tuned circuit 14, 21 to idler termination 22.

In this way bandwidths up to 40% could be obtained, in certain cases however at the expense of stability.

It is apparent that quadruple and quintuple tuned circuits can be made to work in accordance with the principles set forth above. However, in this case, alignment would require careful consideration.

Figure 5:
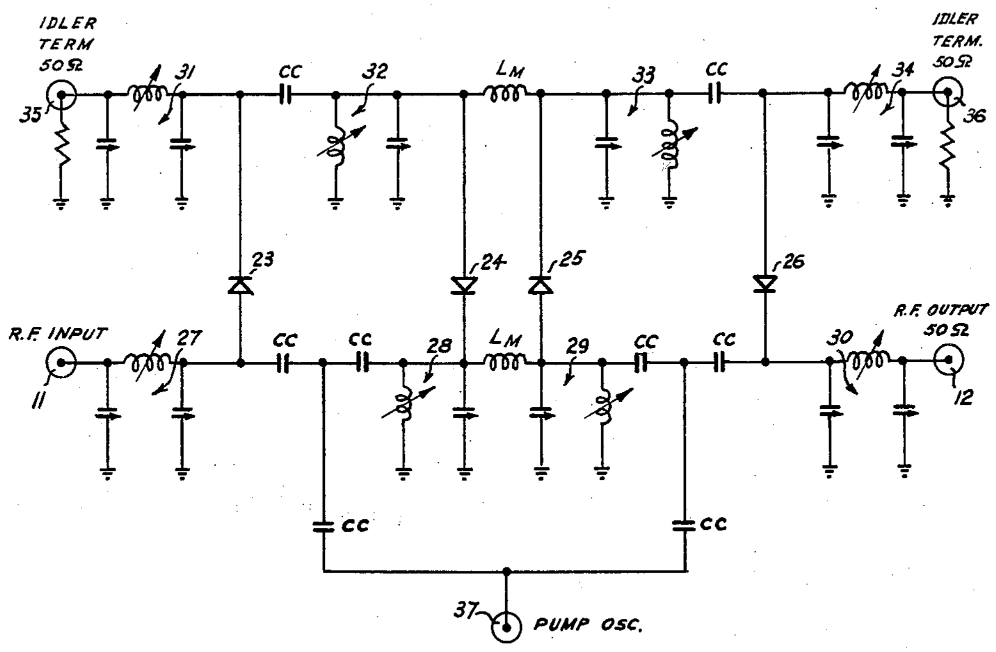

An example of a quadruple tuned circuit is illustrated in FIG. 5 in which four varactors in pairs 23, 24 and 25, 26 are push-pull connected at one side thereof (and at alternatingly reversed terminals) over four tuning circuits 27, 28, 29 and 30 to radio frequency input and radio frequency output terminals 11, 12, respectively, while their other sides are connected similarly and symmetrically over tuned circuits 31, 32, 33 and 34 to two idler terminations 35, 36 respectively. A pump oscillator is connected at 37 to symmetrical points between varactor pairs 23, 24 and 25, 26 in the manner illustrated in FIG. 5.

In this case, both idler and radio frequency networks are represented each by four tuned filter type circuits.

Figure 6:
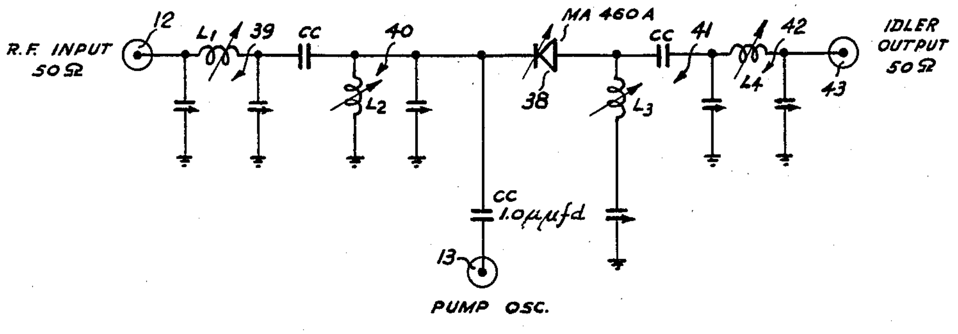
FIG. 6 shows the invention applied to an up-converter.

FIG. 6 shows a modification of FIG. 2 in which the circuit of FIG. 1 is transformed into an up-converter including a varactor 38 connected at one side over tuned circuits 39, 40 to radio frequency input 11 and pump oscillator terminal 13, respectively, while the other side of varactor 38 is connected over tuned circuits 41, 42 to idler output terminal 43 supplying the modulating frequency.

It should be noted, however, that for best operation the following rules should be observed:

(1) Minimum "C" is needed across the varactor for maximum gain bandwidth.

(2) An idler termination at the lower sideband is necessary.

(3) A varactor may be used with multi-pole networks and a varactor may be placed at each pole. This may cause difficulties in stability which will have to be carefully considered.

(4) Particularly good results may be obtained without a D.C. return on the varactor.

If necessary, in this connection, two varactors may be used without departing from the scope of this invention.

Figure 7:
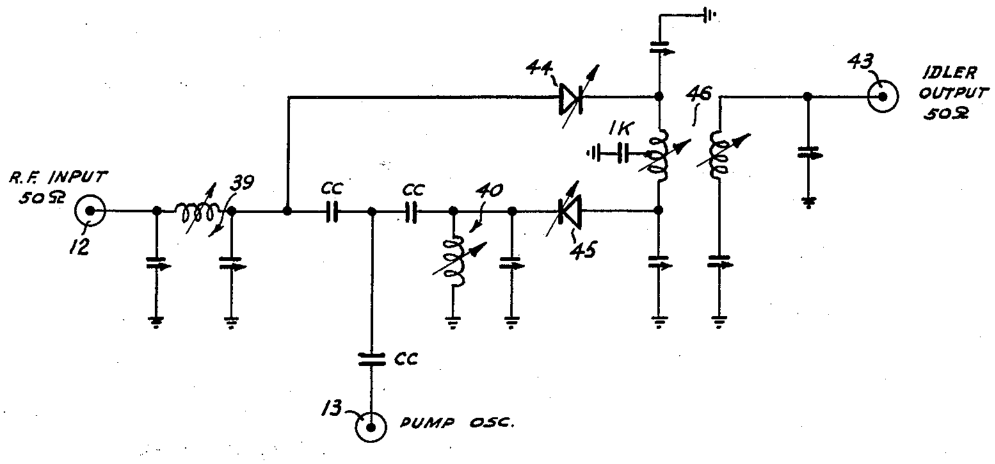
FIGS. 7 and 8 show modifications of FIG. 6.

An example of an up-converter using two varactors is illustrated in FIG. 7 in which varactors 44, 45 are shown to be push-pull connected over tuned circuits 39, 40 to radio frequency input terminals and pump oscillator terminals 12, 13 respectively while the other side of varactors 44, 45 is shown to be inductively coupled over double tunable coupling 46 to idler output terminal 43.

In this case, too, double tuned input and output circuits are used in accordance with the invention.

Figure 8:
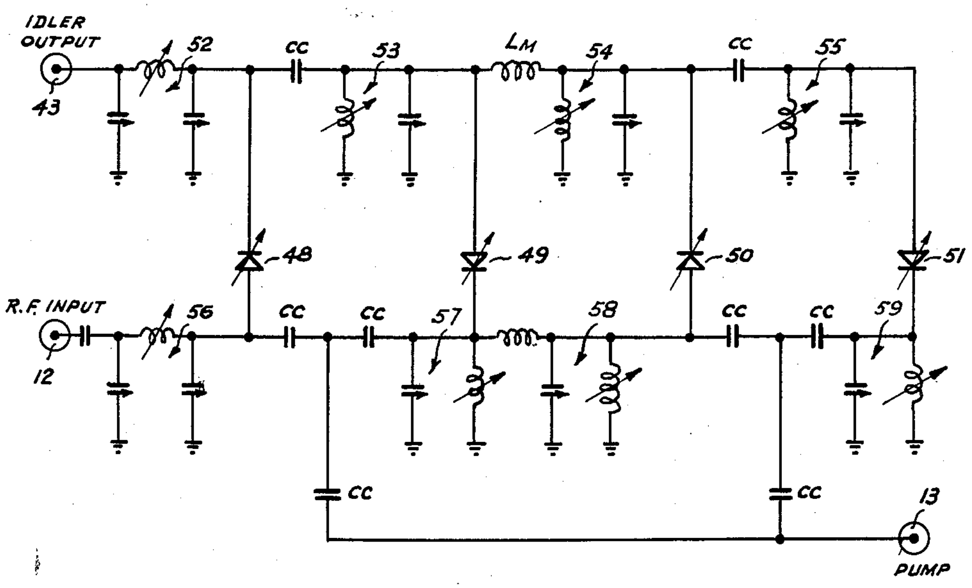

FIG. 8 shows the invention applied to an up-converter using four varactors indicated at 48, 49, 50 and 51, alternatingly connected in reverse polar relationship, over tuned circuits 52, 53, 54 and 55 to idler output terminal 43 on one side of varactors 48 to 51 while the other sides of varactors 48 to 51 are similarly connected over four tuned circuits 56, 57, 58 and 59 to radio frequency input terminals 11. The pump oscillator is connected over terminal 13 to symmetrical points of the radio frequency input circuit between varactor pairs 48, 49 and 50, 51 respectively.

In this case input and output circuits are used which are quadruple tuned, in accordance with the invention.

While in the embodiments and examples of the invention, illustrated and described, the invention has been applied to particular circuit elements and element connections, and to a multiplicity of elements and connections, the invention may be used in any form or manner whatsoever without departing from the scope of this disclosure.

I claim:

1. In a non-linear reactance device, radio frequency input and output circuits, a pair of double tuned band pass filter networks having one side of each coupled separately to said radio frequency circuits, a non-linear reactance uni-conducting element having one side coupled to the other side of one of said networks directly and to the other side of the other network capacitively, a third double tuned band pass filter network coupled to the other side of said uni-conducting element at one side thereof, an idler circuit coupled to said third network at the other side thereof, and a pump circuit having a frequency of at least double the frequency of said radio frequency input and coupled to said uni-conducting element at least on said one side thereof.

2. In a non-linear reactive device, a pair of double tuned band pass filter networks, radio frequency input and output circuits coupled separately to one side of said networks, a pump circuit having a frequency of at least double the frequency of said radio frequency input and capacitively coupled to the other side of said networks, a pair of non-linear reactive uni-conducting elements also coupled at one side thereof to the other side of said networks, respectively; a third double tuned band pass filter network inductively coupled at one side thereof to both said uni-conducting elements at their other sides thereof; and an idler circuit including a fixed impedance termination and coupled to said third network at the other side thereof.

3. In a non-linear reactive amplifier, radio frequency input and output circuits, a pair of double tuned band pass filter circuits coupled, at one side thereof, to said radio frequency circuits separately; a pump circuit having a frequency of at least double the frequency of the radio frequency input and capacitively coupled to each of said band pass filter circuits at the other side thereof, a pair of non-linear uni-directional elements having one side coupled to said other sides of said band pass filter circuits, the other sides of said uni-directional elements being inductively coupled to each other; an idler circuit including a fixed impedance termination, and a third double tuned band pass filter circuit connected at one side to said idler circuit and on the other side inductively coupled to the other side of said uni-conductant elements.

4. In a non-linear reactive amplifier, radio frequency input and output circuits, first and second double tuned band pass filter circuits coupled, respectively, at one side thereof, to said radio frequency circuits separately, and, at the other side thereof, to another band pass filter circuit, a pump oscillator and a non-linear uni-conducting element both connected to the other side of the first band pass filter circuit, an idler termination circuit, and third and fourth band pass filter circuits connected in series between the other side of said uni-conducting element and said idler termination.

5. In a non-linear reactant device, radio frequency input and output circuits, a pair of idler termination circuits and pairs of uni-directional elements connected in push-pull; pairs of band pass filter circuits connected in cascade between said idler terminations, and other pairs of band pass filter circuits connected in cascade between said radio frequency circuits; said push-pull connected uni-conducting elements being arranged to connect the junction line of successive band pass filter circuits of the different pairs, and a pump oscillator capacitively coupled to the junction line of the elements of the pairs of band pass filter circuits connected between the radio frequency circuits.

6. In a non-linear reactive amplifier, a radio frequency input circuit and an idler output circuit, a non-linear uni-conducting element, a pair of double tuned filter circuits including a band pass filter circuit connected in cascade between said radio frequency input circuit and one side of said uni-conducting element, and a pair of filter circuits also including a double tuned band pass filter connected between said idler output circuit and the other side of said uni-conducting element, and a pump oscillator connected to said one side of the uni-conducting element.

7. In a non-linear reactive device, a radio frequency input circuit and an idler output circuit, a non-linear uni-conducting element, a pair of band pass filter circuits connected in cascade between said radio frequency circuit and said uni-conducting element at one side thereof, another uni-conducting element arranged in push-pull with respect to said first uni-conducting element and connected at one side thereof to the junction line of said band pass filter circuits; the other sides of said uni-conducting elements being inductively coupled to each other; and a third band pass filter circuit connected to said idler output circuit and inductively coupled to said other sides of said uni-conducting elements; and a pump oscillator capacitively coupled to the junction line of said first two band pass filter circuits.

8. In a non-linear reactive device, a radio frequency input circuit and an idler output circuit, pairs of tunable band pass filter circuits connected in separate cascades to said input and output circuits, respectively, and interconnected respectively at the junction line of uni-conducting elements by means of pairs of non-linear uni-conducting elements arranged in push-pull, and a pump oscillator capacitively coupled to the junction line of adjacent elements of the cascade of pairs of band pass filter circuits connected to the radio frequency input circuit.

References Cited in the file of this patent

UNITED STATES PATENTS

| | | |
|---|---|---|
| 2,719,223 | Van der Ziel et al. | Sept. 27, 1955 |
| 2,838,687 | Clary | June 10, 1958 |
| 2,951,207 | Hudspeth | Aug. 30, 1960 |
| 3,012,203 | Tien | Dec. 5, 1961 |
| 3,025,448 | Muchmore | Mar. 13, 1962 |

FOREIGN PATENTS

| | | |
|---|---|---|
| 206,022 | Australia | Nov. 10, 1959 |

OTHER REFERENCES

Chang et al.: Proceedings of the IRE, July 1958, pages 1383–1386.

Lombardo et al.: AIL Internal Technical Memorandum No. 15. Received in U.S. Patent Office March 25, 1959; 10 pages.

Salzberg et al.: Proceedings of the IRE, June 1958, page 1303.

Landon.: RCA Review, September 1949, pages 387–396.

Heffner et al.: Journal of Applied Physics, September 1958, pages 1321–1331.